United States Patent
Bromberger

(10) Patent No.: US 7,466,206 B2
(45) Date of Patent: Dec. 16, 2008

(54) AMPLIFIER CIRCUIT

(75) Inventor: Christoph Bromberger, Heilbronn (DE)

(73) Assignee: Atmel Germany GmbH, Heilbronn (DE)

( * ) Notice: Subject to any disclaimer, the term of this patent is extended or adjusted under 35 U.S.C. 154(b) by 0 days.

(21) Appl. No.: 11/819,134

(22) Filed: Jun. 25, 2007

(65) Prior Publication Data

US 2008/0122541 A1 May 29, 2008

Related U.S. Application Data

(63) Continuation of application No. PCT/EP2005/013894, filed on Dec. 22, 2005.

(30) Foreign Application Priority Data

Dec. 23, 2004 (DE) .......... 10 2004 062 135

(51) Int. Cl.
*H03F 3/04* (2006.01)
(52) U.S. Cl. .............. 330/311; 330/307
(58) Field of Classification Search ......... 330/98, 330/150, 307, 310, 311
See application file for complete search history.

(56) References Cited

U.S. PATENT DOCUMENTS

| 2,966,434 | A |   | 12/1960 | Robert |   |
|---|---|---|---|---|---|
| 4,317,127 | A | * | 2/1982 | Nishizawa | 257/264 |
| 4,607,273 | A | * | 8/1986 | Sakurada et al. | 257/152 |
| 5,084,750 | A | * | 1/1992 | Adlerstein | 257/574 |
| 5,159,207 | A | * | 10/1992 | Pavlin et al. | 327/534 |
| 5,654,671 | A |   | 8/1997 | Murray |   |
| 6,483,168 | B1 |   | 11/2002 | Chiu |   |
| 7,245,189 | B2 |   | 7/2007 | Seremeta |   |

FOREIGN PATENT DOCUMENTS

| DE | 1 121 656 | 1/1962 |
| DE | 693 15 813 T2 | 12/1997 |
| DE | 697 17 047 T2 | 11/2002 |
| EP | 1424772 A | 6/2004 |
| JP | 2000-323935 | 11/2000 |
| WO | WO 02/27920 A1 | 4/2002 |

OTHER PUBLICATIONS

Melito M et al: "Bipolar-MOS monolithic cascode switch in VIPower technology" Industrial Application Society Annual Meeting, 19943, Conference Record of the 1994 IEEE Denver, CO, USA Oct. 2-6, 1994, New York, NY, USA, IEEE, Oct. 2, 1994, pp. 1322-1325, XP010124240 ISBN: 0-7803-1993-1 the whole document.

* cited by examiner

*Primary Examiner*—Henry K Choe
(74) *Attorney, Agent, or Firm*—Muncy, Geissler, Olds & Lowe, PLLC

(57) ABSTRACT

Amplifier circuit for amplifying an input signal, having a vertically integrated cascode that has a collector semiconductor region of a collector, adjacent to the collector semiconductor region, a first base semiconductor region of a first base, a second base semiconductor region of a second base, an intermediate base semiconductor region adjoining both the first base semiconductor region and the second base semiconductor region, and an emitter semiconductor region of an emitter adjacent to the second base semiconductor region, wherein a signal input is connected to the second base, and the first base is electrically coupled both to a voltage source that is independent of the input signal and to the collector.

4 Claims, 1 Drawing Sheet

AMPLIFIER CIRCUIT

This nonprovisional application is a continuation of International Application No. PCT/EP2005/013894, which was filed on Dec. 22, 2005, and which claims priority to German Patent Application No. DE 102004062135, which was filed in Germany on Dec. 23, 2004, and which are both herein incorporated by reference.

BACKGROUND OF THE INVENTION

1. Field of the Invention

The present invention relates to an amplifier circuit.

2. Description of the Background Art

Cascode stages are known from prior art, in particular having two bipolar transistors, for example two npn transistors or two pnp transistors, wherein the collector of the first of the two transistors is connected to the emitter of the second of the two transistors.

For the most part, cascode stages are operated in a standard configuration that is described below and illustrated in FIG. 2. The emitter of the first transistor Q1' is connected to ground (common-emitter circuit), while an input signal is present at the base. The base of the second transistor Q2' is connected to a fixed DC voltage $U_B$ (common-base circuit), while the collector is connected to the supply voltage $V_{CC}$ through a load resistor $R_L'$. Standard configuration cascode circuits frequently serve as a substitute for single transistors. One reason for this is the excellent consistency of the output current over output voltage for fixed control current.

Another conventional circuit topology for replacing a single transistor by a cascode circuit is a feedback circuit shown in FIG. 3. Here, the feedback branch, which is formed of the resistors R1" and R2", is connected to the load resistor $R_L''$ and also to the base of the first transistor Q1", so that the output voltage is fed back to the input of the first transistor Q1" as well as to the input of the second transistor Q2".

SUMMARY OF THE INVENTION

It is therefore an object of the present invention to provide an amplifier circuit that reduces as much as possible intermodulation distortion when a vertically integrated cascode structure is used.

Accordingly, provision is made for an amplifier circuit for amplifying an input signal, in particular a high frequency signal of a radio transmission. This amplifier circuit has a vertically integrated cascode, which in turn has a collector semiconductor region of a collector, a first base semiconductor region of a first base adjacent to the collector semiconductor region, a second base semiconductor region of a second base, an intermediate base semiconductor region adjoining both the first and second base semiconductor regions, and an emitter semiconductor region of an emitter adjacent to the second base semiconductor region.

A vertically integrated cascode of this nature can be integrated with further components on a semiconductor wafer. Preferably, the vertically integrated cascode has pn junctions that are oriented essentially planar to the wafer surface and/or are arranged essentially parallel to one another. According to the invention, the signal input is connected to the second base.

In an embodiment, a first base is electrically coupled both to a voltage source that is independent of the input signal and to the collector. Preferably the electrical coupling achieves the effect that the voltage at the first base tracks an applied collector voltage with like polarity.

Electrical coupling here is understood to mean any coupling that achieves a dependence of the voltage at the first base on the collector voltage. For example, capacitive, inductive, or magnetic couplings are possible. However, a simple voltage coupling through the use of a voltage divider, in particular one which is formed by resistors, is especially preferred.

Tracking is preferably understood to mean that a change in the collector voltage leads to a change in the voltage at the first base which has the same arithmetic sign. In this regard, the mathematical relationship between the voltage at the first base and the collector voltage can be logarithmic or proportional, for example. Preferably, the relationship is specified by at least one proportionality factor, which can be set by resistors.

A further embodiment of the invention provides that, for the purpose of electrical coupling, the first base can be connected to the collector through a first resistor and the first base is also connected to the voltage source through a second resistor. In a preferred embodiment of the invention, the voltage source is a DC voltage source, advantageously a temperature-stable reference voltage source, which preferably has an internal resistance that is lower than the resistors and/or other impedances of the amplifier circuit.

In an embodiment of the invention, provision is made that at least one of the base semiconductor regions has a silicon/germanium mixed crystal. This embodiment of the invention, in particular, makes possible a preferred use of the amplifier circuit in a data transmission system, in particular in a radio system (UMTS).

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

BRIEF DESCRIPTION OF THE DRAWINGS

The present invention will become more fully understood from the detailed description given hereinbelow and the accompanying drawings which are given by way of illustration only, and thus, are not limitive of the present invention, and wherein.

DETAILED DESCRIPTION

Figure 4:
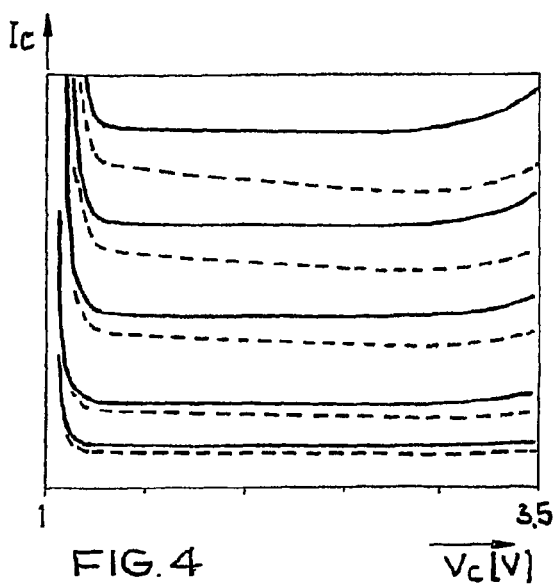
FIG. 4 is a characteristic curve of the collector current of the cascode over collector voltage.

In FIG. 4, the output characteristic curve of a vertically integrated cascode in a standard configuration is shown with dashed lines. This exhibits a pronounced negative differential resistance, which can correspond to an Early voltage of –20 V, for example. The lack of consistency of the amplification, also called nonlinearity, which expresses itself in a low absolute value of the Early voltage, produces poor intermodulation characteristics, in particular, which is to say that different frequency components of a signal strongly interfere with one another. Yet the output current should ideally be independent of the output voltage.

To explain the unsatisfactory Early characteristics of a vertically integrated cascode, also called a tetrode, these characteristics are detailed below with reference to a cascode composed of two npn transistors. One peculiarity of active, bipolar, high frequency components is the relationship between the dopant concentration in the collector drift zone, hereinafter referred to as "collector doping," and the transient behavior of the component.

In active forward-biased operation of an npn transistor, negatively charged electrons move at their saturation speed through the space charge zone of the reverse-biased base-collector junction. Positively charged ion cores in fixed positions are located in the collector-side portion of the base-collector space charge zone of a transistor. If the concentration of electrons becomes comparable to the density of the fixed charge, the space charge zone is displaced toward the collector (Kirk effect), the effective base becomes wider, and the signal propagation delay through the base increases.

The current density at the onset of the Kirk effect is proportional to the doping in the collector drift zone. The charging time at the onset of the Kirk effect and the minimum sum of the base propagation delay and collector charging time thus decreases with increasing collector doping. Accordingly, high frequency transistors are characterized by high collector doping and can be operated at a high current density.

The breakdown voltage of the base-collector diode drops with increasing collector doping. Applications of active components require a certain achievable voltage swing and consequently also a minimum blocking capability.

In the emitter and collector of an npn transistor, electrons constitute the majority charge carriers. At moderate current densities, the base and the base-collector space charge zone represent an electron-poor zone, so that the thermodynamic reservoir of electrons in the emitter region is essentially isolated from that in the collector region. As a result of an increase in the current density, at final saturation velocity, the concentration of mobile charge carriers in the electron-poor zone is increased and the thermodynamic isolation of the two reservoirs is reduced.

In an application-relevant reverse voltage range, the current density in a transistor is sufficiently low at the maximum achievable unity gain crossover frequency that the two reservoirs can be viewed as being independent of one another to a good approximation. The blocking capability of a transistor used for current amplification in a common-emitter circuit is determined in this context by the breakdown voltage of the base-collector diode divided by a factor of 2.5 to 11.

Figure 5:
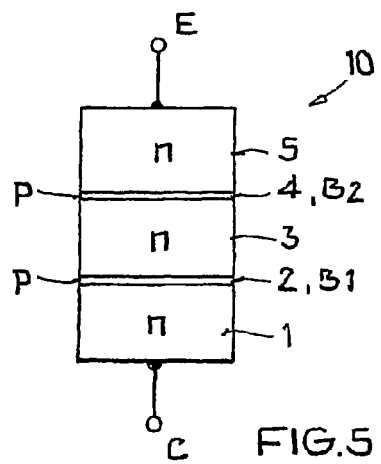
FIG. 5 is a schematic representation of a vertically integrated cascode.

A vertically integrated cascode 10 is shown schematically in FIG. 5. It has a collector connection C, a first base connection B1, a second base connection B2, and an emitter connection E. The vertically integrated cascode 10 includes a collector semiconductor region 1 of a collector C, a first base semiconductor region 2 of a first base B1 adjacent to the collector semiconductor region 1, a second base semiconductor region 4 of a second base B2, an intermediate base semiconductor region 3 adjoining both the first base semiconductor region 2 and the second base semiconductor region 4, and an emitter semiconductor region 5 of an emitter E adjacent to the second base semiconductor region 4. In the exemplary embodiment shown here, the semiconductor regions 1, 3 and 5 are n-doped, while the semiconductor regions 2 and 4 are p-doped.

The blocking capability of a vertically integrated cascode 10 of this nature is determined by the breakdown voltage of the base-collector diode 1, 2 of the transistor Q1'/Q1" operated in a common-base circuit. Accordingly, it is possible for collector doping in a vertically integrated cascode 10 to be many times higher than in a transistor with a comparable blocking capability. In particular, the current density in a high frequency cascode 10 is sufficiently high at the maximum unity gain crossover frequency that the electron reservoirs in the intermediate base region 3 and in the collector semiconductor region 1 are no longer isolated from one another to a good approximation. The collector voltage thus reaches through into the intermediate base region 3.

In an embodiment of the invention, the intermediate base region 3 is not contacted. The voltage in the uncontacted intermediate base region 3 of the vertically integrated cascode 10 is dependent on the voltage(s) present at the existing contacts and on the current density. When the collector voltage reaches through into the intermediate base region 3, the electrical potential in the intermediate base region 3 changes in the same direction as the collector voltage.

Accordingly, for a fixed voltage at the first base B1, the base-emitter voltage in transistor Q1'/Q1" decreases with increasing collector voltage, causing the transistor Q1'/Q1" to be regulated down. This is the basis for the negative differential output resistance of the vertically integrated cascode 10 in the standard configuration, as is shown by the dashed lines in the characteristic curves in FIG. 4.

Figure 1:
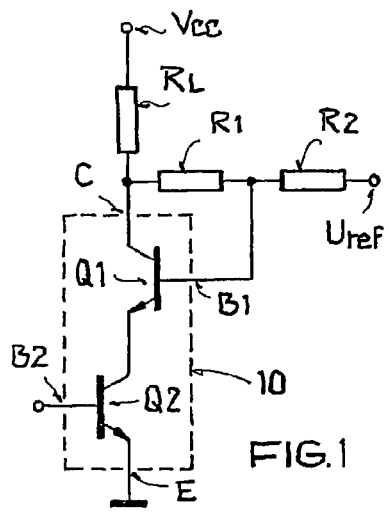
FIG. 1 is an amplifier circuit with a vertically integrated cascode.
Figure 2:
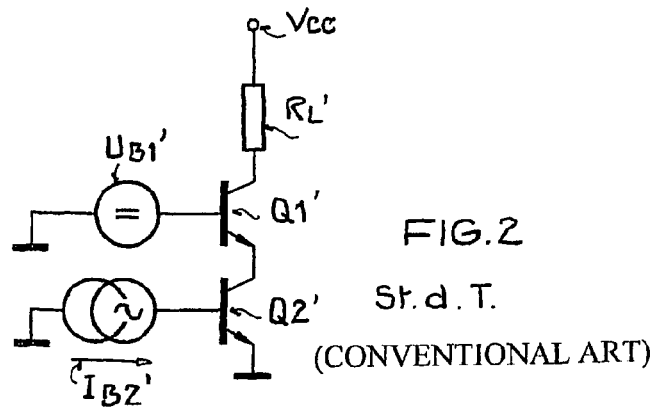
FIG. 2 is a conventional configuration of a cascode.
Figure 3:
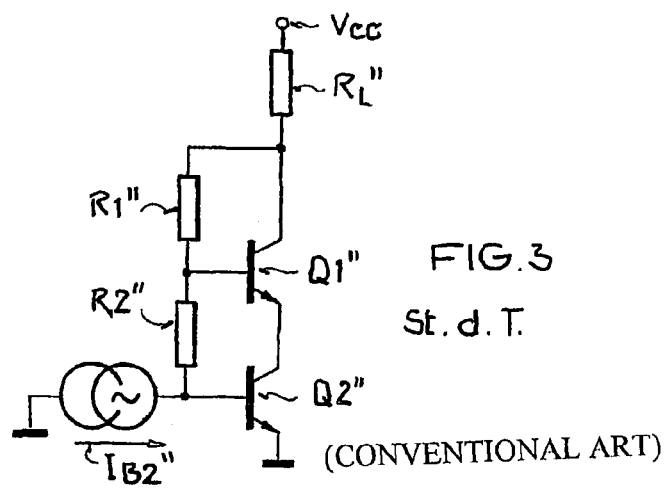
FIG. 3 is a configuration of a cascode with a feedback branch according to the conventional art.

FIG. 1 shows an inventive configuration of the vertically integrated cascode 10. The vertically integrated cascode 10 is configured here in such a manner that the voltage of the first base B1 tracks the collector voltage with like polarity. This achieves the result that the magnitude of the output resistance is increased.

Of course, the invention is not limited to the specific circuit example from FIG. 1. Rather, all electrical couplings, such as current mirror circuits, voltage sources, etc., that cause the voltage at the first base B1 to track the collector voltage with like polarity, can be used. In this regard, the tracking is preferably proportional to the collector voltage. This achieves an output characteristic curve such as is shown schematically in FIG. 4 by the solid lines. It is also possible to use a vertically integrated cascode having appropriately complementary pnp transistors instead of the vertically integrated cascode 10 having npn transistors Q1, Q2.

The invention being thus described, it will be obvious that the same may be varied in many ways. Such variations are not to be regarded as a departure from the spirit and scope of the invention, and all such modifications as would be obvious to one skilled in the art are to be included within the scope of the following claims.

What is claimed is:

1. An amplifier circuit for amplifying an input signal, having a vertically integrated cascode, the vertically integrated cascode comprising:

a collector semiconductor region of a collector;

a first base semiconductor region of a first base being adjacent to the collector semiconductor region;

a second base semiconductor region of a second base;

an intermediate base semiconductor region adjoining both the first base semiconductor region and the second base semiconductor region; and an emitter semiconductor region of an emitter being adjacent to the second base semiconductor region, wherein a signal input is connected to the second base and the first base is electrically coupled both to a voltage source that is independent of the input signal and to the collector.

2. The amplifier circuit according to claim 1, wherein, for the purpose of electrical coupling, the first base is connected to the collector through a first resistor, and wherein the first base is connected to the voltage source through a second resistor.

3. The amplifier circuit according to claim 1, wherein at least one of the base semiconductor regions has a silicon/germanium mixed crystal.

4. The amplifier circuit according to claim 1, wherein the amplifier circuit is provided for a high frequency circuit for communications, in particular mobile radio applications.

* * * * *